US009791689B1

United States Patent
Hupkens et al.

(10) Patent No.: US 9,791,689 B1
(45) Date of Patent: Oct. 17, 2017

(54) JOINING OF PIXEL WALL AND PHOTOSPACERS IN AN ELECTROWETTING DISPLAY

(71) Applicant: Amazon Technologies, Inc., Seattle, WA (US)

(72) Inventors: Ronald Francois Henri Hupkens, Malden (NL); Jeroen Cornelis van der Gaag, Mierlo (NL); Toru Sakai, Waalre (NL)

(73) Assignee: Amazon Technologies, Inc., Seattle, WA (US)

( * ) Notice: Subject to any disclaimer, the term of this patent is extended or adjusted under 35 U.S.C. 154(b) by 41 days.

(21) Appl. No.: 14/974,837

(22) Filed: Dec. 18, 2015

(51) Int. Cl.
G02B 26/00 (2006.01)
G03F 7/16 (2006.01)
G03F 7/20 (2006.01)
G03F 7/32 (2006.01)
G03F 7/40 (2006.01)
G03F 7/00 (2006.01)

(52) U.S. Cl.
CPC ......... *G02B 26/005* (2013.01); *G03F 7/0007* (2013.01); *G03F 7/16* (2013.01); *G03F 7/162* (2013.01); *G03F 7/2002* (2013.01); *G03F 7/32* (2013.01); *G03F 7/40* (2013.01)

(58) Field of Classification Search
USPC .................................................. 359/290–295
See application file for complete search history.

(56) References Cited

U.S. PATENT DOCUMENTS

| | | | |
|---|---|---|---|
| 9,140,891 B2 * | 9/2015 | Novoselov | G02B 26/005 |
| 9,229,221 B1 * | 1/2016 | Massard | G02B 26/005 |
| 9,348,132 B1 * | 5/2016 | Novoselov | G02B 26/005 |

* cited by examiner

*Primary Examiner* — Mohammed Hasan
(74) *Attorney, Agent, or Firm* — Lee & Hayes, PLLC

(57) ABSTRACT

An electrowetting display comprises a bottom support plate including pixel walls and a top support plate that includes spacers. The pixel walls and/or the spacers may be joined together to create a joined spacer and pixel wall before being fully cured. In some configurations, the pixel walls and the spacers are made from photoresist that is not fully cured before assembly of the display. After aligning the spacers over the pixel walls, the spacers and pixel walls are joined. In some configurations, the junction of the pixel walls and the spacers is exposed to UV light to more fully cure the photoresist. In addition, or alternatively to exposure to the UV light compressive force may be applied to fuse the pixel walls and spacers. The assembled display may also be exposed to a final bake to more fully cure the photoresist.

19 Claims, 8 Drawing Sheets

JOINING OF PIXEL WALL AND PHOTOSPACERS IN AN ELECTROWETTING DISPLAY

BACKGROUND

Electronic displays are found in numerous types of electronic devices such as electronic book ("eBook") readers, cellular telephones, smart phones, portable media players, tablet computers, wearable computers, laptop computers, netbooks, desktop computers, televisions, appliances, home electronics, automotive electronics, augmented reality devices, and so forth. A type of electronic display known as an electrowetting display includes an array of pixels individually bordered by pixel walls that retain a fluid such as opaque oil, for example. Light transmission through each pixel is adjustable by electronically controlling a position of the fluid in the pixel. Resolution and quality of an electrowetting display may depend on a number of factors, such as optical transmissivity or reflectivity of material layers of the electrowetting display and pixel size, just to name a few examples. Improving the structural stability of displays, such as electrowetting displays, to help protect against damage from impact forces, can be challenging.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

Figure 1:
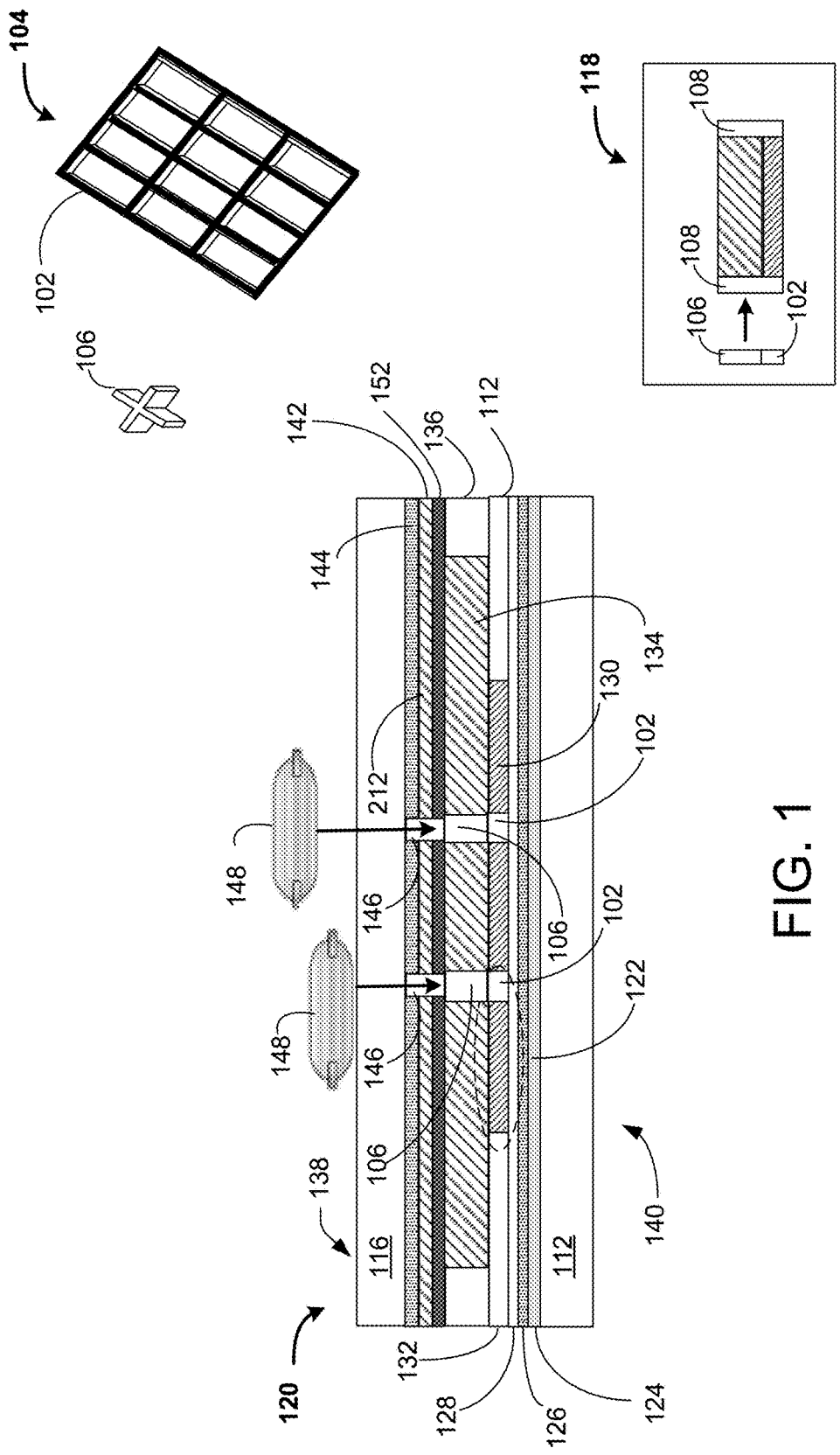
FIG. 1 is a diagram showing the joining of spacers on a top support plate with pixel walls on a bottom support plate.

In various examples described herein, electronic devices include electrowetting displays for presenting content. A display device, such as an electrowetting display device, can be a transmissive, reflective, or transflective display that generally includes an array of display elements (e.g., pixels or subpixels that make up pixels) configured to be operated by an active matrix addressing scheme. A display element may generally comprise a pixel or subpixel of an electrowetting display device. Such a pixel or subpixel may be the smallest element of a display that is individually operable to directly control an amount of light transmission or reflection through the element. For example, in some implementations, a display element may be a pixel that includes one or more of a red subpixel, a green subpixel, a blue subpixel or a white subpixel, i.e. a red-green-blue-white (RGBW) display. In other implementations, a display element may be a pixel that is a smallest component, e.g., the pixel does not include any subpixels.

Individual pixels or subpixels are surrounded by pixel walls made, for instance, from photoresist material. In some configurations, the pixel walls are disposed on the bottom support plate. Pixel walls retain at least a first fluid which is electrically non-conductive, such as opaque or colored oil, in the individual pixels or subpixels. A cavity formed between the support plates is filled with the first fluid (e.g., an electrowetting oil retained by pixel walls) and a second fluid (e.g., an electrolyte solution) which is electrically conductive or polar and may be water or a salt solution such as a solution of potassium chloride in water. The second fluid may be transparent, but may be colored or light absorbing. The second fluid is substantially immiscible with the first fluid so that the first fluid and the second fluid do not substantially mix with each other, and in some examples do not mix with each other to any degree. Herein, substances are immiscible with one another if the substances do not substantially form a solution.

In some examples, spacers and edge seals may be used to mechanically connect the bottom support plate with the overlying top support plate. The spacers provide a separation between the bottom support plate and the top support plate, and contribute to mechanical strength of the electrowetting display. As discussed in more detail below, the spacers may be joined to the pixel walls. Joining the pixel walls to the spacers may result in a display that is more structurally stable and strong as compared to a display that does not join the pixel walls to the spacers.

In some configurations, the spacers are placed throughout the display. For example, a spacer may be placed at each corner of the pixel walls, at every other corner, or at other locations along the pixel walls. In other configurations, a spacer may be a full grid spacer that covers all, or a majority of the pixel walls. The spacers placed between the support plates may be the same width as the pixel wall or a different width from the pixel wall. In some examples, the spacers have a cross-like shape that are substantially a similar width as the pixel wall. Increasing the spacer surface area may increase the resistance of the display to damage by impact forces, such as dropping the display or dropping some object onto the display.

The spacers and pixel walls may be made from the same material (e.g., a photoresist such as SU-8), or some other material and may be transparent, black, or some other color. In some examples, the spacers are designed and formed such that the refractive index of the spacer is similar to the refractive index of the electrolyte. While a negative photoresist SU-8 is used in some examples, other types of photoresists may be used. SU-8 is considered a thick film photoresist material. SU-8 is known to have very good chemical and mechanical stability. According to some examples, the pixel walls are formed using photoresist material that is coated on the bottom support plate. The spacers may be formed using photoresist material that is coated on the top support plate. There are many different types of SU-8 that may be used. For instance, SU-8 that may be used as a photoresist material may include SU-8 2, SU-8 5, SU-8 10, SU-8 25, SU-8 50, SU-8 100, SU-8 2002, SU-8 2005, SU-8 2007, SU-8 2010, SU-8 2015, SU-8 2025, SU-8

2035, SU-8 2050, SU-8 2075, and SU-8 2100 depending on the specifications of the pixel walls and/or spacers.

The primary components of SU-8 are a Bisphenol A Novolak epoxy oligomer and up to 10 wt % triarylsulfonium hexafluroantimonate salt photoacid generator. Upon exposure to a UV light source (or possibly other types of irradiation sources, such as x-ray), the photoacid generator decomposes to form hexafluoroantimonic acid that protonates the epoxides on the oligomer. These protonated oxonium ions are available to react with neutral epoxides in a series of cross-linking reactions after application of heat. Lithographic structures formed using SU-8 may exhibit high mechanical and thermal stability. For example, fully cross-linked SU-8 may have a glass-transition temperature around ~200° C., degradation temperature ~380° C. and a Young's modulus E ~4-5 GPa.

In addition to SU-8, there are a number of commercially available photoresists that may be utilized. For example, photoresists from AZ Electronic Materials, Dow, DuPont, Electra Polymers Ltd., Eternal Chemical, Fujifilm Electronic Materials, Hitachi Chemical, HiTech Photopolymere AG, JSR Micro, Kolon Industries, MacDermid, MicroChem, Rohm and Haas (subsidiary of Dow), Sumitomo Chemical and Tokyo Ohka Kogyo Co., Ltd. Some of the photoresists may be available in liquid form and other photoresists may be available in powder form. Generally, the different types of photoresists have different viscosities, and processing characteristics (e.g., different development times). Some photoresists are designed for different thicknesses (e.g., 1 µm to about 300 µm), In general, to create the pixel walls on the bottom support plate and the spacers on the top plate, a photoresist layer is first coated (e.g., using spin-coating or slit-coating) to enable a desired thickness of the pixel walls (e.g., 3-5 µm) and a desired thickness of the spacers (e.g., about 20 µm) after processing the photoresist layer. Generally, the height of the processed photoresist layer used for the pixel walls is the depth of the oil thickness. The pixel walls are designed to prevent the oil from moving from one pixel to another (e.g., prevent overflow of the oil from one pixel to the neighboring pixel). The height of the spacers is based on the spacing between the bottom support plate and the top support plate.

The pixel walls may be formed onto a hydrophobic layer, e.g. a fluoropolymer layer. In some configurations, the hydrophobic layer may be pretreated before coating to create a surface that is physically compatible with the photoresist material to adhere to the surface. After coating the hydrophobic layer with the desired thickness of photoresist layer, a pre-exposure bake may be performed. The pre-exposure bake refers to exposing the photoresist layer to a relatively low temperature (e.g., about 100-130° C.) for a short period of time. The period of time that the photoresist layer is subject to the pre-exposure bake may be a few minutes and is generally less than fifteen minutes. The pre-exposure bake is directed at reducing any remaining solvent concentration that exists in the photoresist layer.

After the pre-exposure bake, a pixel wall mask is placed over the photoresist layer. In some examples, a chrome mask is used to form the pixel walls on the bottom support plate. According to some configurations, the pixel walls border a pixel of 150 nm by 150 µm thus having a length in both directions of 150 µm. The final width of the pixel wall can be based on the photoresist material and the used equipment (exposure tool and mask). Typical pixel widths are in the range of 8 to 12 µm. Other shaped pixel walls may be formed (e.g., rectangular) using the pixel wall mask.

Similarly, a spacer mask may be placed over the photoresist layer coated on the top support plate. The spacer mask is used to form the shape of the spacers (e.g., square, rectangular, cross-like shape). In some configurations, the spacers are cross-like shape having approximately the same width as the pixel walls. In other configurations, the spacer may be a grid-like structure that covers the pixel walls.

After placing the pixel wall mask over the photoresist layer, the photoresist layer is exposed to light, such as UV light (e.g., around 400 nm) until the exposed photoresist layer receives a dose of light between about 20 mJ and 500 mJ (depending on the thickness and sensitivity of the photoresist layer). Generally, the exposure of the photoresist material that is not covered by the pixel wall mask causes a chemical change in the photoresist material. When positive type photoresist is used, the exposed regions of the photoresist become soluble in a developer that is applied after the exposure. In a negative type photoresist, on the other hand, the unexposed regions are soluble in the developer.

Similarly, after placing the spacer mask over the photoresist layer on the top support plate, the photoresist layer is exposed to UV light. Generally, since the spacers have a greater height as compared to the pixel walls, the photoresist layer is thicker and the dose of UV light applied to the photoresist to form the spacers is higher as compared to the dose applied to the photoresist layer to form the pixel walls. The exposure time is generally related to the type of photoresist material used as well as the thickness of the photoresist layer.

A post-exposure bake may be performed after the photoresist layer receives the desired dosing of UV light. In some examples, the post-exposure bake is similar to the pre-exposure bake in that the photoresist layer is exposed to a relatively low temperature (e.g., about 100-130° C.) for a short period of time (e.g., five minutes).

After the post-exposure bake, the exposed photoresist layer is subjected to a developer solution. In some examples, the developer may be sprayed onto the exposed photoresist layer, and/or delivered on a spin coater, much like a photoresist can be coated. Application of the developer causes a portion of the photoresist layer to be washed away, thereby defining the pixel walls and/or the spacers. After subjecting the photoresist on the bottom support plate to the developer, the pixel walls are formed on the bottom support plate. Similarly, after subjecting the photoresist on the top support plate to the developer, the spacers are formed on the top support plate.

Typically in the process of creating pixel walls and/or spacers, the photoresist layer would be subjected to a hard bake (e.g., a final bake). A hard bake is used to help stabilize and harden the photoresist layer, which may be referred to herein as "fully curing" the photoresist. A hard bake may subject the photoresist layer to a relatively higher temperature (e.g., above 200° C.) for a period of time (e.g., 15 minutes to hours). The hard bake is designed to remove any of the remaining traces of the developer.

According to some examples, the photoresist material used to form the pixel walls and the spacers is not exposed to a hard bake or final bake before assembly. Instead, the photoresist material remains in a somewhat uncured state such that the pixel walls on the bottom support plate may be joined with the spacers located on the top support plate. In some examples, the uncured state results in the spacers and/or the pixel walls being "tacky" or "sticky". Joining the pixel walls with the spacers may help in achieving increased structural stability, as opposed to non-joined spacers and pixel walls. The joining may also provide improved uniformity of display spacing between the top support plate and the bottom support plate.

Different techniques may be performed to fuse the spacers with the pixel walls before the spacers and pixel walls are fully cured. Before joining the spacers and the pixel walls, the bottom support plate is aligned with the top support plate such that the spacers on the top support plate are located over the pixel walls on the bottom support plate. As discussed herein, in some examples, the spacers are to be placed over the corners of the pixel walls. In other examples, the spacers may be placed at other locations over the pixel walls (e.g., every other corner).

According to some configurations, the junctions between the pixel walls and the spacers are exposed to UV light for a short period of time (e.g., one minute to fifteen minutes). In some examples, the light source is positioned such that the light enters through an opening in a black matrix that is located above the spacer and exposes the junctions to the UV light. The UV light is used to more fully cure the photoresist material.

Additionally, or alternatively, compressive force may be used to fuse the spacers with the pixel walls. For instance, after aligning the spacers with the pixel walls, a force may be applied such that the spacers and the pixel walls are pressed together with sufficient force to fuse the spacers with the pixel walls. In some examples, a combination of exposing the pixel walls and spacers to the UV light as well as applying the compressive force is utilized when joining the spacers with the pixel walls.

After joining the spacers and the pixel walls, a final bake may or may not be performed. The final bake may be performed in an attempt to "harden" the joined spacers and pixel walls. In some examples, the final bake may be similar to the pre-exposure bake (e.g., exposure to about 130° C. for about five minutes to fifteen minutes) or may be at a higher temperature compared to a pre-exposure bake or post-exposure bake (e.g., exposure to about 220° C. for some period of time, such at 30 minutes to hours).

In various examples, a display element of a display device includes, among other things, an electrode layer and a thin film transistor (TFT) that is switched to either select or deselect the electrowetting element using active matrix addressing. A TFT is a particular type of field-effect transistor that includes thin films of an active semiconductor layer as well as a dielectric layer and metallic contacts over a supporting substrate, which may be glass or any of a number of other materials, for example. Generally, there are various layers between the TFTs and the first fluid.

Electrowetting displays include an array of display elements comprising pixels and/or subpixels located between two support plates, such as a first substrate and a second substrate. For example, the first substrate may be a bottom support plate that, in cooperation with the second substrate (which may be a top support plate), contains display elements that include at least one electrode, a first fluid being an electrowetting oil, a second fluid that includes an electrolyte (i.e. an electrolyte solution) and pixel walls between the support plates. The substrates or support plates may comprise glass support plates, or any of a number of other amorphous materials, such as plastic (e.g., a transparent thermoplastic such as PMMA or other acrylic), quartz, semiconductors, and so on, and may be made of a rigid or flexible material. At least one of the support plates may comprise a transparent material. Herein, describing an element or material as being "transparent" means that the element or material can transmit a relatively large fraction of the light incident upon it. For example, a transparent substrate or support plate or layer may transmit more than 70% or 80% of the light impinging on its surface, though claimed subject matter is not limited in this respect. In addition to display elements, spacers and edge seals can also be located between the support plates.

In some examples, a display device as described herein can comprise a portion of a system that includes one or more processors and one or more computer memories, which may reside on a control board, for example. Display software can be stored on the one or more memories and can be operable with the one or more processors to modulate light that is received from an outside source (e.g., ambient room light) or out-coupled from a light guide of the display device. For example, display software can include code executable by a processor to modulate optical properties of individual pixels or subpixels of the electrowetting display based, at least in part, on electronic signals representative of image or video data. The code can cause the processor to modulate the optical properties of pixels or subpixels by controlling electrical signals (e.g., voltages, currents, fields, and so on) on, over, or in layers of the electrowetting display.

In examples, an array of color filter elements may be disposed on the top support plate to provide various colored pixels or subpixels within the electrowetting display. During operation of the electrowetting display, a pixel or subpixel may be activated and the second fluid moves onto the hydrophobic layer thus displacing the first fluid, e.g. towards a pixel wall. In a reflective type electrowetting display light enters the pixel or subpixel through the color filter element and is reflected back through the pixel or subpixel, through the color filter element. Thus, depending on the color of the color filter element, various colors can be produced by the electrowetting display. For example, for an RGBW display, the display includes red, green, blue and white color filter elements. Thus, the light entering the electrowetting fluids and reflecting out of the pixels or subpixels will have one of a red color, a green color, a blue color, a white color. While a reflective electrowetting type display is described, other types of electrowetting displays (e.g., transmissive, transflective) may include the joined spacers and pixel walls as described herein.

In examples, a black matrix grid may be included. While the black matrix is disclosed herein as being black in order to block the passage of light therethrough, the matrix may be another color. In various examples, the black matrix is disposed on the top support plate and substantially aligned with the pixel walls disposed on the bottom support plate. In some configurations, an opening is formed in the black matrix to allow UV light to reach the junction of the pixel wall and the spacer. More details regarding joining spacers with pixel walls are provided below.

FIG. 1 is a diagram showing the joining of spacers on a top support plate with pixel walls on a bottom support plate. As illustrated, FIG. 1 shows different steps involved in joining pixel walls 102 as illustrated in by element 104, and spacers 106 as illustrated by spacer 106. While the display elements formed by the pixel walls 102 are illustrated as rectangular in element 104, the display elements may be other shapes (e.g., squares, triangles). Similarly, while the spacers 106 are shown to be cross-like, other shapes may be used as spacers (e.g., diamond, circular, trapezoidal, square, and the like). As also discussed, the spacers may cover all, or a portion, of the pixel walls, which may be referred to herein as a "grid spacer."

Figure 3:
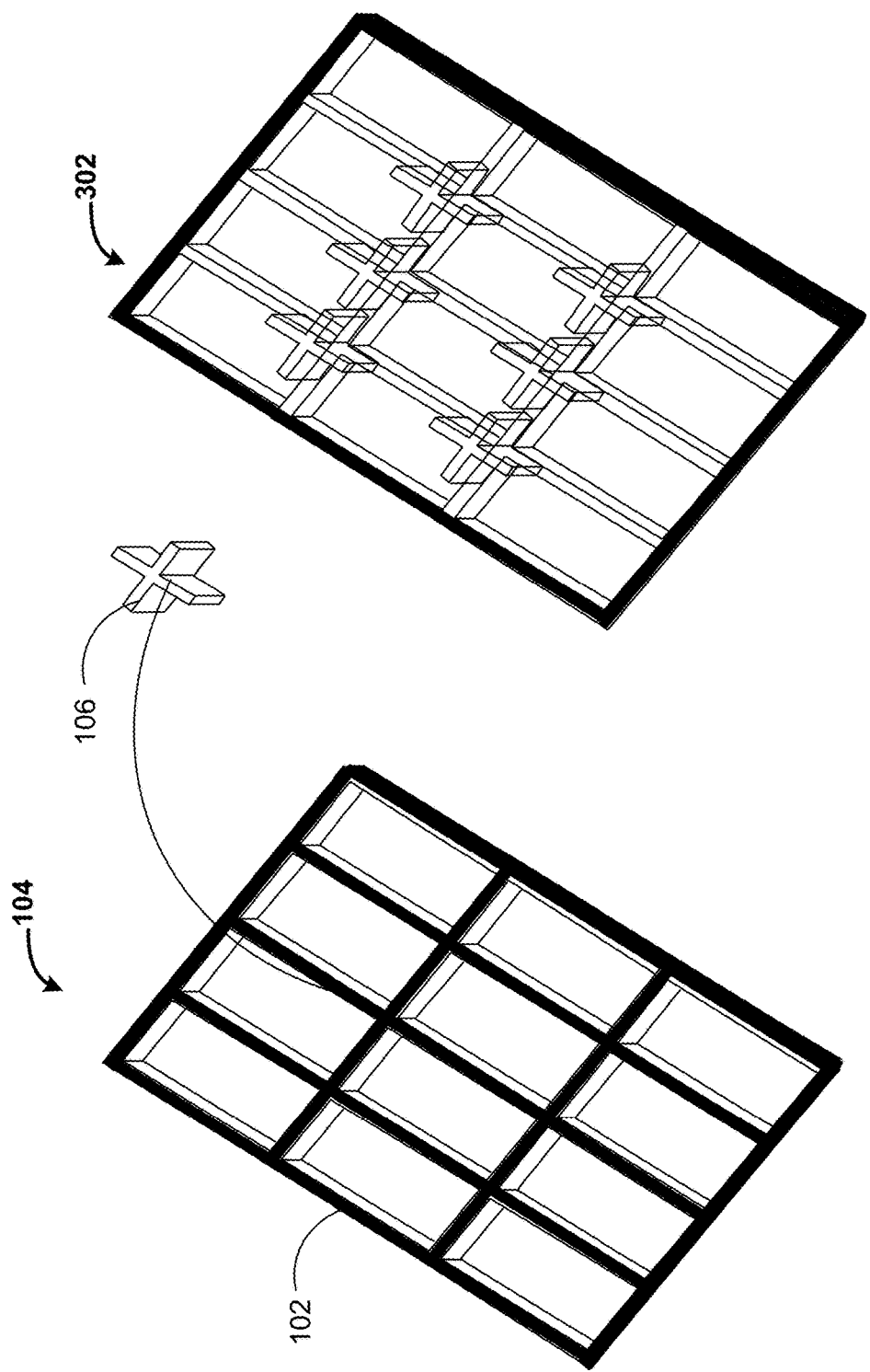
FIG. 3 illustrates a top view of pixel walls and spacers.

As briefly discussed above, the pixel walls 102 and the spacers 106 are formed from photoresist material using a process illustrated in FIG. 3. After creating pixel walls 102 on a bottom support plate 112 and/or spacers 106 on a top support plate 116 that are not fully cured, the spacers 106 and the pixel walls 102 are joined to create a joined spacer and pixel wall 108 as illustrated in element 118.

FIG. 1 illustrates a cross-section of a portion of an electrowetting display device 120 containing several electrowetting display elements 122 according to some examples. Each electrowetting element 122 represents a pixel or a subpixel. An electrode layer 124 is formed on a bottom support plate 112 (e.g., a glass substrate). Additional layers may be formed on the bottom substrate between the bottom substrate and the electrode layer. The electrode layer 124 is generally a layer containing individual pixel electrodes per pixel or subpixel (electrowetting element 122) separated from each other by insulating material (not indicated). In some implementations, an optional dielectric barrier layer 126 may at least partially separate electrode layer 124 from a hydrophobic layer 128 also formed on the bottom support plate 112.

In some implementations, the hydrophobic layer 128 can comprise a fluoropolymer, such as AF1600®, produced by DuPont, based in Wilmington, Del. The hydrophobic layer 128 can also be any of a number of water-repelling materials that affect wettability of an adjacent material, for example. In examples, the hydrophobic layer 128 is a coating on the dielectric layer 126.

Pixel walls 102 form a patterned electrowetting element grid on the hydrophobic layer 128. The pixel walls 102 may comprise a single grid or may comprise a plurality of intersecting pixel walls to form the patterned electrowetting element grid. As discussed briefly above, the pixel walls 102 may comprise a photoresist material, such as epoxy-based negative photoresist SU-8, for example. In some configurations, the pixel walls 102 are absorbing and non-transparent, e.g. colored or black, in order to prevent or minimize the passage of light therethrough.

The patterned electrowetting element grid comprises rows and columns that form an array of electrowetting elements 122. For example, an electrowetting element 122 can have a width and length in a range of about 50 to 500 μm. A first fluid 130, such as an oil, which can have a thickness (e.g., depth or height) in a range of about 1 to 10 μm, for example, overlies the hydrophobic layer 128. The first fluid 130 is partitioned by the pixel walls 102 of the patterned electrowetting element grid. An outer rim 132 can comprise the same material as the pixel walls 102. A second fluid 134, such as an electrolyte solution, overlies the first fluid 130 and the pixel walls 102 of the patterned electrowetting element grid.

A top support plate 116 opposite to the bottom support plate 112 covers the second fluid 134 and edge seals 136 retain the second fluid 134 over the array of electrowetting elements. The top support plate 116 may be supported by edge seals 136 and spacers 106 that are interspersed throughout the array of electrowetting elements 122. For example, some or all spacers 106 may be located over at least a portion of the regions where pixel walls 102 intersect. In some examples, a spacer 106 is located above the corners formed by the pixel walls 102.

A voltage V applied across the second fluid 134 and the pixel electrodes within the electrode layer 124 of individual electrowetting elements 122 can control transmittance or reflectance of the individual electrowetting elements 122. The electrowetting display device has a viewing side 138 on which an image formed by the electrowetting display device 120 can be viewed, and a rear side 140. The top support plate 116 faces viewing side 138 and the bottom support plate 112 faces rear side 140. In an alternative example, the electrowetting display device 120 may be viewed from the rear side 140.

The electrowetting display device 120 may be a reflective, transmissive, or transflective type. The electrowetting display device 120 may be an active matrix driven display type or a passive matrix driven display, just to name a few examples.

The second fluid 134 is substantially immiscible with the first fluid 130. As previously noted, the second fluid 134 may be an electrolyte solution. An electrolyte solution can be electrically conductive or polar, and may be water or a salt solution such as a solution of potassium chloride in a mixture of water and ethyl alcohol, for example. The second fluid 134 is preferably transparent, but may be colored or light absorbing. The first fluid 130 is electrically non-conductive and may for instance be an alkane like hexadecane or (silicone) oil. In examples, the first fluid may be referred to as electrowetting oil. The hydrophobic layer 128 is arranged on the bottom support plate 112 to create an electrowetting surface area. The hydrophobic character causes the first fluid 130 to adhere preferentially to the hydrophobic layer 128 since the first fluid 130 has a higher wettability with respect to the surface of the hydrophobic layer 128 than the second fluid 134. Wettability relates to the relative affinity of a fluid for the surface of a solid. Wettability increases with increasing affinity, and it can be determined by measuring the contact angle formed between the fluid and the solid and is measured internal to the fluid of interest. For example, such a contact angle can increase from relative non-wettability for a contact angle of more than 90° to complete wettability for a contact angle of 0°, in which case the fluid tends to form a film on the surface of the solid.

The first fluid 130 absorbs at least a part of the optical spectrum. The first fluid 130 may be transmissive for a part of the optical spectrum, forming a color filter. For this purpose, the first fluid 130 may be colored by addition of pigment particles or dye, for example. Alternatively, the first fluid 130 may be black (e.g., absorbing substantially all parts of the optical spectrum) or reflecting. In examples, any of the layers on bottom support plate 112 may have reflective properties. Additionally, a reflective layer (not illustrated) may also be positioned above the bottom support plate 112. Such a reflective layer (or other layers having reflective properties) may reflect the entire visible spectrum, making the layer appear white, or part of it, making it have a color.

When a voltage is applied across an electrowetting element 120 via a common electrode 152—disposed on the top support plate 116 and a corresponding pixel electrode within electrode layer 124, the electrowetting element 122 enters into an active state. Electrostatic forces impart motion to the second fluid 134 toward the electrode layer 124, thereby displacing the first fluid 130 causing the first fluid 130 to contract on an area of the hydrophobic layer next to the pixel walls 102, in a droplet-like form. This action uncovers the first fluid 130 at least partly from the surface of the hydrophobic layer 128 of the electrowetting element 122. When the voltage across the electrowetting element 122 is returned to an inactive signal level of zero or a value near to zero, the electrowetting element 122 returns to an inactive state, where the first fluid 130 flows back to cover the hydrophobic layer 128. In this way, the first fluid 130 forms an electrically controllable optical switch in each electrowetting element 122. Of course, such details of an electrowetting display device are merely examples.

In examples, the electrowetting display device 120 may include a color filter layer 142 that is configured as an array of color filter elements. Additionally, the electrowetting display device 120 may include a black matrix grid layer 144 that is configured as a grid of black structures or walls. The black matrix grid generally aligns with edges between individual color filter elements. The black matrix grid layer 144 is generally processed on the top support plate 116 first. Then the various color filter elements in the color filter layer 142 are created by lithographic steps. The individual color filter elements may be in contact with each other on top of the black matrix grid but that is generally not visible from the viewing side 138 of the electrowetting display device 120 as the black matrix grid layer 144 is the first layer on the top support plate 116.

After deposition of the color filter elements, a conducting layer is deposited that serves as the common electrode 152 for the electrowetting display device 120. In some examples, the black matrix grid layer 144 includes openings 146 to allow light to reach the junction of the spacer 106 and the pixel wall 102. In some examples, the openings 146 are smaller than the pixel wall and/or spacer dimension. In other examples, the black matrix grid may include transparent, or at least somewhat transparent, openings that allow light to reach the junctions of the pixel wall and the associated spacer. According to some configurations, as discussed in more detail below, a light source 148 is used after the top support plate 116 is aligned with the bottom support plate 112 in the joining of the pixel wall 102 to the spacers 106 to create the joined spacer and pixel wall 108.

Figure 2:
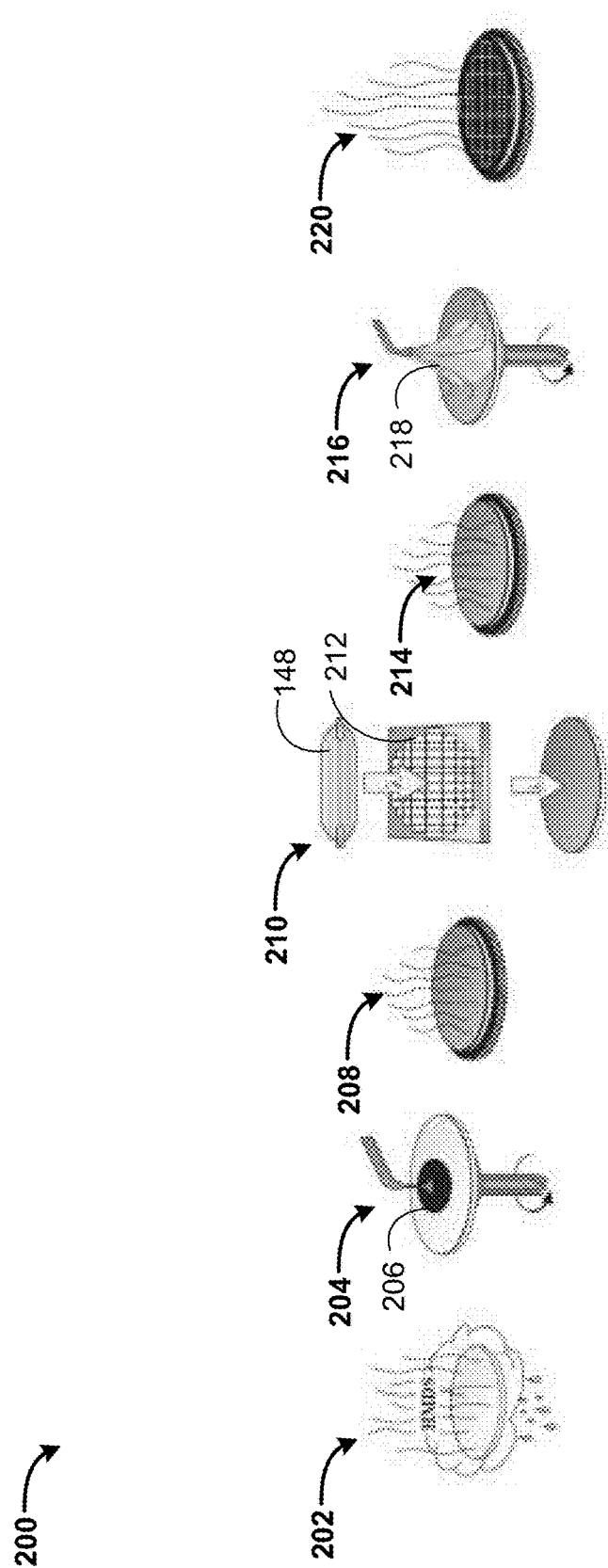
FIG. 2 shows a routine illustrating aspects of a technique disclosed herein for creating pixel walls and/or spacers.

After forming the spacers 106 and the pixel walls 102 as discussed in more detail in FIG. 2, the display device 120 may be created. As discussed above, the pixel walls 102 and the spacers 106 may be joined in an attempt to increase the structural stability of the device. The joining may also result in a more uniform display device 120 that has the same, or substantially the same, spacing between the top support plate 116 and the bottom support plate 112 across the display device 120. In some examples, instead of performing a final bake of the top support plate 116 with the spacers 106 and the final bake of the bottom support plate 112 with the pixel walls 102, the spacers 106 are joined with the pixel walls 102.

As can be seen in the cross-section of display device 120, the pixel walls 102 are aligned with the spacers 106. In other examples, the spacers may be placed at other locations over the pixel walls (e.g., every other corner). After positioning the spacers 106 and the pixel walls 102, the spacers and the pixel walls are joined to form a joined spacer and pixel wall 108 as illustrated in element 118.

Different techniques may be used to fuse the spacers with the pixel walls. In some configurations, the junctions (e.g., locations) where the pixel walls 102 intersect with the spacers 106 are exposed to UV light. According to some examples, the light source 148 is positioned such that the UV light enters through an opening 146 in the black matrix layer 144 and exposes the locations where the spacers are in contact with the pixel walls with the UV light. In some examples, the junction of the pixel wall 102 and the spacer 106 is exposed to light for a period of about fifteen minutes (e.g., depending on the photoresist material). Other times may be used depending on the properties and thickness of the photoresist material. Exposure of the junctions to the UV light is directed at more fully curing the photoresist material used to create the spacers 106 and/or the pixel walls 102.

In some configurations, compressive force may be used to fuse the spacers with the pixel walls. For instance, after aligning the spacers 106 with the pixel walls 102, a force may be applied such that the spacers and the pixel walls are pressed together with sufficient force to fuse the spacers with the pixel walls. In some examples, a combination of exposing the pixel walls and spacers to the UV light as well as applying the compressive force is utilized when joining the spacers with the pixel walls.

FIG. 2 shows a routine 200 illustrating aspects of a technique disclosed herein for creating pixel walls and/or spacers. In some examples, the technique illustrated 200 may be used to form the pixel walls 102 and/or the spacers 106. As illustrated, the technique 200 includes a surface preparation 202 step to remove contaminates prior to coating the top support plate 116 or the bottom support plate 112 with photoresist material.

The surface preparation step is designed to remove dust, abrasive particles, photoresist residue, bacteria, solvent residue, water residue, oil, silicon, or other contaminants that may decrease the adhesion of the photoresist material. In some configurations, to increase adhesion of photoresist material, the support plate is treated with hexamethyldisilazane (HMDS). HMDS may be dispensed in liquid form onto the support plate held by a vacuum chuck in a spin coater. In other examples, HMDS may be applied in gas form. The use of HMDS helps to ensure that the surface being coated with the photoresist is hydrophobic.

After the surface preparation at 202, the bottom support plate 112 (the "bottom support plate") and/or the top support plate 116 may be coated with photoresist material 206, such as SU-8, as illustrated at 204. As discussed above, different techniques such as spin-coating or slit-coating may be used to coat photoresist material onto a support plate. Generally, the photoresist material 204 coated onto a support plate is a viscous, liquid solution that may be spun onto the support plate.

In some configurations, spin-coating may be performed to dispense the photoresist layer onto the support plate that is affixed to a plate that is rotating between 1200 to 4800 rpm for 30 to 60 seconds depending on the desired thickness. In some examples, the spin coating produces a thickness that allows a final height of the pixel walls 102 to be about 3 to 5 µm high and about 20 µm high for spacers 106. The support plate may be coated with different thicknesses of photoresist material depending on the desired height of the pixel wall and/or the spacers. In some examples, different photoresist materials may be used for the formation of the pixel walls 102 and/or the spacers 106. Generally, spin coating produces a uniform thickness of a photoresist layer on the surface of the support plate.

After coating, the photoresist layer is exposed to a pre-exposure bake (e.g., soft-baked) as illustrated at 208. Generally, a pre-exposure bake or soft-baking refers to exposing the photoresist layer 206 coated on the support plate to a low temperature (e.g., about 100-130° Centigrade) for a short period of time. The period of time that the photoresist layer is exposed to the pre-exposure bake may be a few minutes and is generally less than fifteen minutes. In some examples, the pre-exposure bake is for about 5 minutes at about 120° C. For thicker coatings of photoresist, the time of the pre-exposure bake may be longer. The pre-exposure bake is directed at reducing any remaining solvent that exists in the photoresist layer. The pre-exposure bake may also improve the adhesion of the photoresist material to the support plate.

Next, at 210, a mask 212 is placed over the support plate that is coated with the photoresist material. Different masks 212 may be used depending on the desired structure. For example, a pixel wall mask can be used to form the pixel walls 102 in the photoresist layer. When forming spacers, a spacer mask may be utilized. In some examples, a chrome mask is created to form the pixel walls on the bottom support plate. As discussed above, the pixel wall mask lays out the locations of the pixel walls that are used to store the oil used in the electrowetting display. In some examples, a chrome mask is used to form the spacers and the pixel walls. A chrome mask allows transmission of UV light through some areas of the mask while preventing the transmission of UV light through other areas of the mask.

In some configurations, the pixel walls border a pixel of 150 μm by 150 μm thus having a length in both directions of 150 μm. The pixel wall mask, however, may form pixel walls of any shape or size. For instance, the pixel wall mask may form rectangular regions. In some examples, the spacer mask form spacers 106 that are cross-like in shape. The spacer mask, however, may form spacers of other shapes (e.g., diamond, circular, different cross-shapes, square, and the like).

After covering the photoresist layer with the mask, the photoresist material is exposed to UV light produced by one or more light sources, such as light source 148. The exposure of the photoresist layer that is not covered by the mask causes a chemical change to the photoresist material. When positive photoresist material is used, the exposed regions of the photoresist layer become soluble in the developer. In negative photoresist material, on the other hand, the unexposed regions are soluble in the developer. In some examples, the UV light may be a single light source or multiple light sources. For instance, the source light 148 may be a mercury lamp that is filtered to emit wavelengths between about 350-450 nm. The light source might also be a laser, one or more Light Emitting Diodes (LED)s, or some other type of light source. In some examples, the wavelength of the light is 436/405 nm light with the exposed dose provided to the photoresist being about 20 mJ to approximately 500 mJ depending on the thickness and sensitivity of the photoresist.

At 214, a post-exposure bake may be performed after exposing the photoresist layer to the UV light. The post-exposure bake 214 resembles the pre-exposure bake. In some examples, the post-exposure bake is about five minutes at 130° C.

At 216, the photoresist layer is subjected to a developer 218. In some examples, the developer 218 may be sprayed onto the photoresist layer, and/or delivered on a spin coater, much like photoresist material is coated at 204. Metal-ion-free developers such as tetramethylammonium hydroxide (TMAH) are used in some examples (e.g., 2.38 weight %). According to some configurations, 150 ml/plate of developer may be used to develop the photoresist. After exposing the photoresist layer on the bottom support plate 112 to the developer 218, the pixel walls 102 are formed on the bottom support plate 112. Similarly, after exposing the photoresist layer on the top support plate 116 to the developer 218, the spacers 106 are formed on the top support plate 116. Exemplary pixel walls 102 and exemplary spacers 106 are shown in FIG. 3. In some configurations, the pixel walls 102 and the spacers 106 may be subjected to a final bake. U In some examples, a final bake of the pixel walls or spacers may be performed as illustrated by 168. Unlike traditional final bakes, however, the final bake 220 does not fully cure the spacers 106 and the pixel walls 102. Instead, the pixel walls 102 and the spacers 106 remain somewhat "tacky" such that the pixel walls 102 and the spacers 106 may fuse. In some configurations a final bake may not be performed. In other examples, a final bake may be performed in an attempt to "harden" the joined spacer and pixel wall 108. In some configurations, the final bake may resemble to the pre-exposure bake or post-exposure bake. In some examples, the final bake exposes the joined spacers and pixel walls to a temperature of about 130° C. for about five minutes to fifteen minutes. In other examples, a higher temperature up to about 220° C. may be utilized.

FIG. 3 illustrates a top view of pixel walls 102 and spacers 106. As illustrated, element 104 shows a grid of pixel walls that form pixels or subpixels for a display. As discussed above, the pixels may be formed into many different types of shapes, such as but not limited to square, rectangular, and triangular. Similarly, the spacers 106 may be of different shapes or sizes, such as but not limited to cross-like shapes, rectangular shapes, square shapes, triangular shapes, cylindrical shapes, and the like.

In the current example, the pixels are illustrated as rectangular and have pixel walls 102 that are about 3 μm high. Other pixel wall heights may be formed and utilized. The spaces 106 are about 20 μm high. Other spacer heights may be formed and utilized.

In some configurations, the spacers are placed throughout the display. For example, a spacer 106 may be placed at each corner of the pixel walls within the grid of pixels as illustrated by grid 302. In other configurations, the spacers might be placed at every other corner, as a full grid spacer, or at other locations along the pixel walls.

Figure 4:
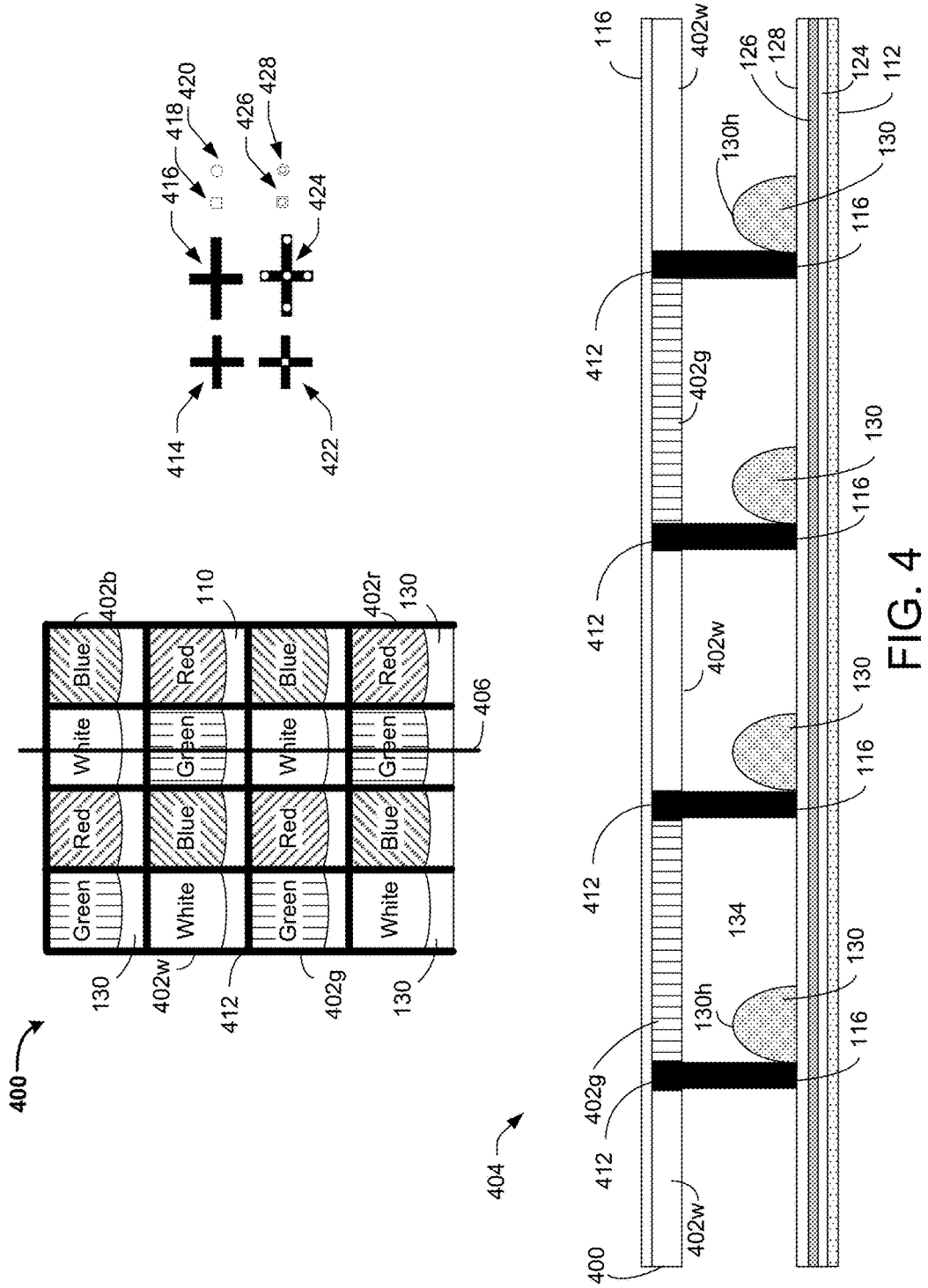
FIG. 4 illustrates a top view and a cross-section of a portion of an electrowetting display device with joined spacers and pixel walls.

FIG. 4 illustrates a top view 400 and a cross-section 404 of a portion of an electrowetting display device 120 including several electrowetting elements 122, according to some examples. Each electrowetting element 120 represents a pixel or a subpixel.

A black matrix grid 412 illustrated in cross section 404 may be included with the array of color filter elements and generally comprises a black material or other dark material to block, or substantially block, the passage of light therethrough. While FIG. 4 illustrates the black matrix grid 412 on a same level as the array of color filter elements, this may not be the case. For example, the black matrix grid 412 may be created in a layer and then the array of color filter elements 402 may be created in a layer on the black matrix grid 412. The array 400 of color filter elements 402 is disposed on the top support plate 116 while the first fluid 130 is disposed on the bottom support plate 112.

In the example of FIG. 4, the color filter elements 402 are arranged for an RGBW display. Thus, the array includes red, green, blue and white color filter elements 402r, 402g, 402b and 402w, respectively. The array may be arranged differently and configured for other types of displays such as, for example an RGB display, an RGBY (red, green, blue, yellow) display, or other type of display. As can be seen in FIG. 4, the individual pixels or subpixels have a rectangular shape, however the individual pixels or subpixels may have other shapes such as, for example, square, triangular, hexagonal, etc. Additionally, the array of color filter elements 402 has a substantially rectangular shape and is thus, shaped for use with an electrowetting display device having a substantially rectangular shape. The array could also have a different shape such as, for example, square, circular, etc. Likewise, an electrowetting display device may also have other shapes such as, for example, square, triangular, etc.

FIG. 4 also includes a schematic of a cross-section of a portion of an example of an electrowetting display device 404 similar to the cross-section of the example electrowetting display device 120 illustrated in FIG. 1, as seen along line 406 of FIG. 4. Various elements of the electrowetting display device may not be illustrated in FIG. 4, or may be illustrated in a simplified fashion, for clarity and ease of description.

The electrowetting display device 404 includes the array disposed on the top support plate 116, with edges of color filter elements 402 substantially aligning with the black matrix grid 412, which substantially aligns with the pixel walls disposed on the bottom support plate 112. Thus, the color filter elements 402 are substantially aligned with the pixels or subpixels (i.e. electrowetting elements 122).

As can be seen in FIG. 4, when a pixel or subpixel (i.e. electrowetting element 120), is activated, i.e. "open," the second fluid 134 replaces the first fluid 130 on the hydrophobic layer 128. The first fluid 120 contracts on the hydrophobic layer 128 towards a corresponding joined spacer and pixel wall 108. A "peak" of the first fluid 130 is a height 130h of the first fluid 130 at maximum contraction. In general, maximum contraction refers to the contraction of the first fluid 130 (i.e. the displacement of the first fluid 130) that provides the largest area of the hydrophobic layer 128 that is in contact with or exposed to the second fluid 134. Incident light entering the pixel or subpixel passes through a corresponding color filter element 402 and is reflected from at least one of electrode layer 124, optional dielectric barrier layer 126, or hydrophobic layer 128, or reflector layer (not illustrated) (collectively referred to herein as "reflective layer") and passes back through the corresponding color filter element 402, thus exiting the electrowetting display device 404.

As discussed briefly above, different shapes may be used for the spacers. For example, a cross-like shape 414 or a cross-like shape 416 may be used. In other examples, the spacers may be shaped as a square 418 or a cylinder 420. While the spacers 414, 416, 418, and 420 are illustrated as having a flat bottom surface, the spacers 106 may be designed such that one or more portions of the spacer extend from the spacer. For example, a small post might extend from the spacers as illustrated by spacers 422, 424, 426, and 428.

In some configurations, the surfaces of the pixel walls 102 and/or the spacers 106 may be treated before joining. For example, the surfaces may be roughened to enhance friction between the spacers and the pixel walls, or may be smoothed to increase the contact between the pixel walls and the spacers. According to some configurations, the spacers and pixel walls may be interlocking shapes (e.g., male/female). For instance, an indentation in the pixel wall may receive a post that extends from the spacer.

Figure 5:
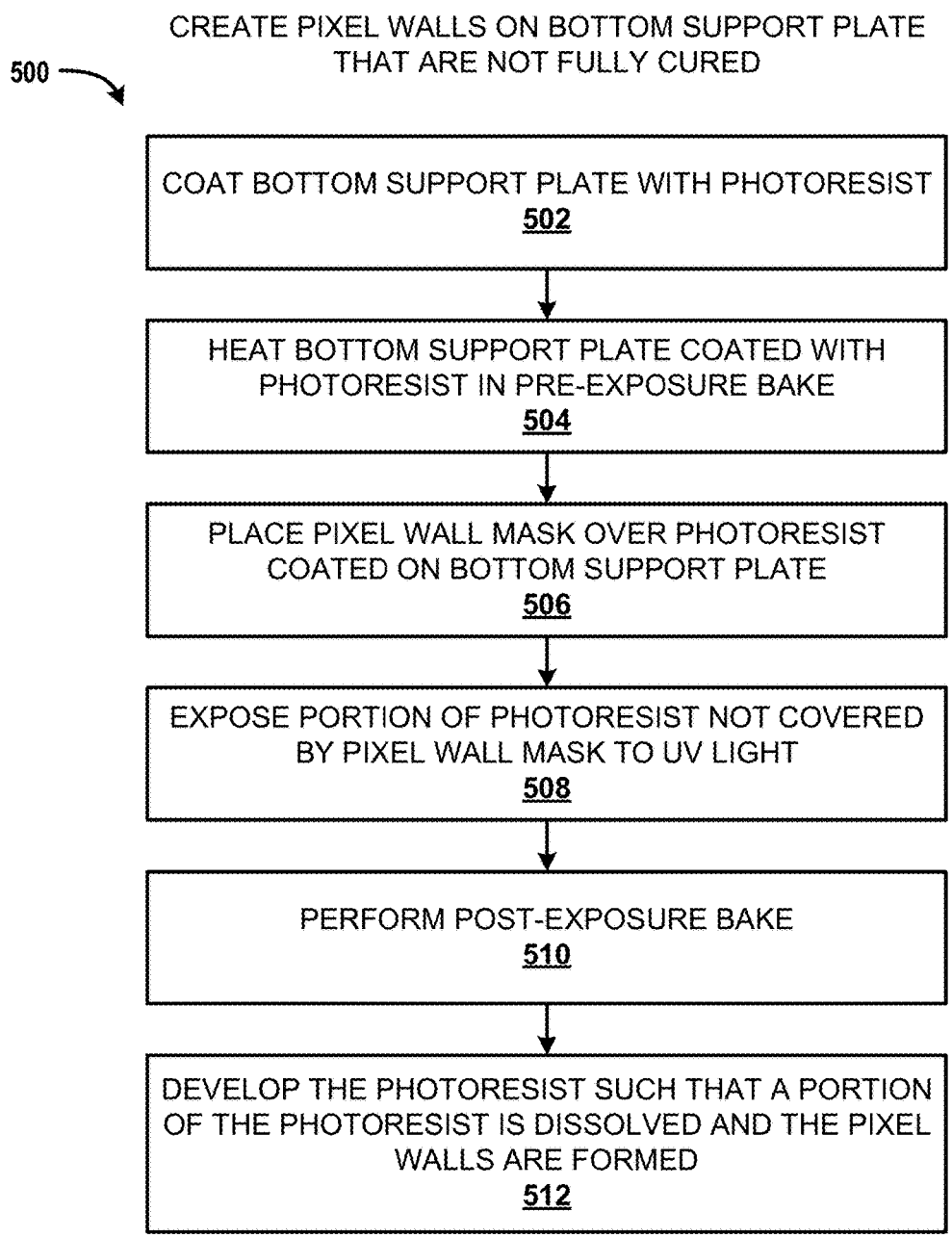
FIG. 5 is a flow diagram showing a routine illustrating aspects of a mechanism disclosed herein for creating pixel walls on a support plate that are not fully cured.
Figure 6:
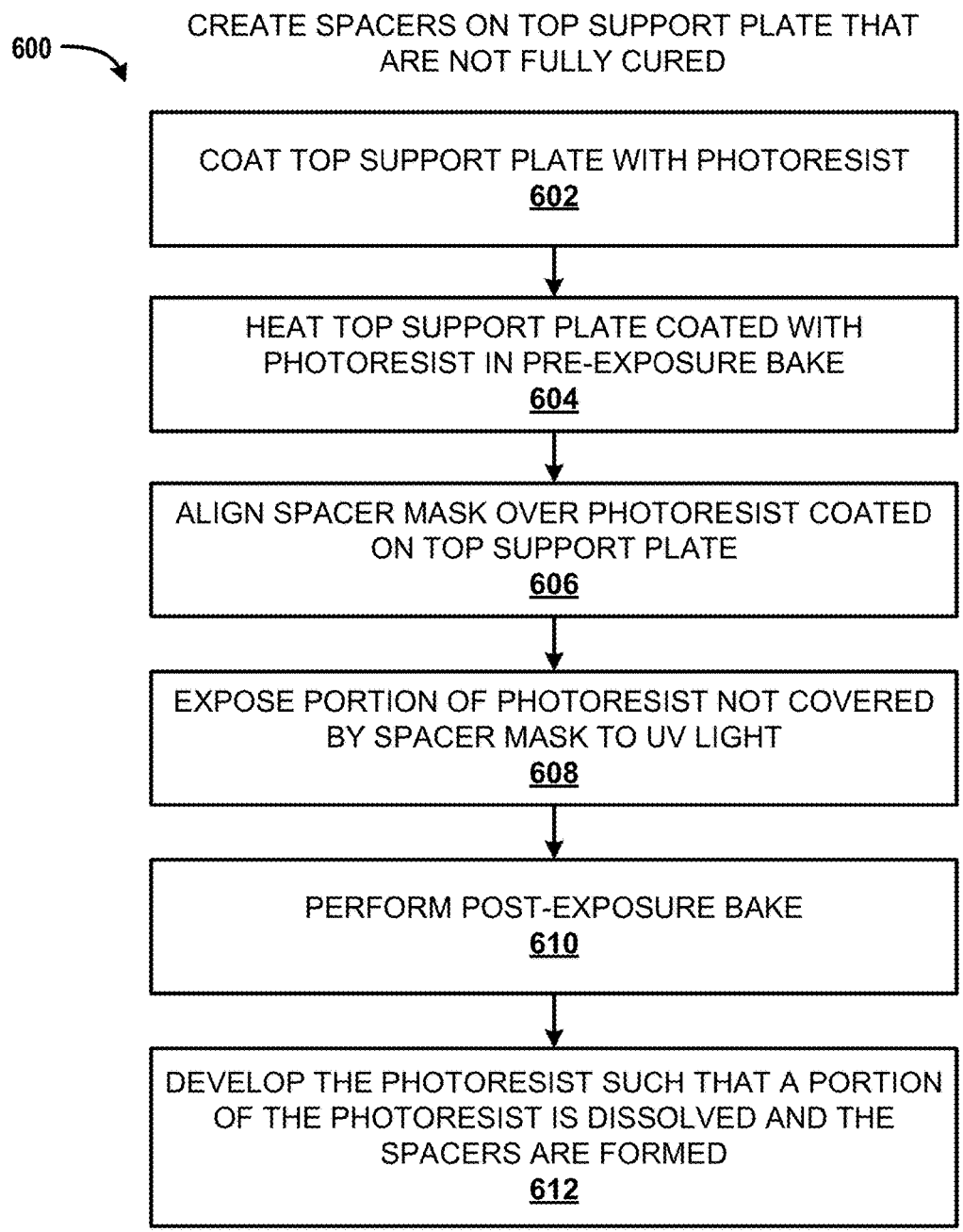
FIG. 6 is a flow diagram showing a routine illustrating aspects of a mechanism disclosed herein for creating spacers on a support plate that are not fully cured.
Figure 7:
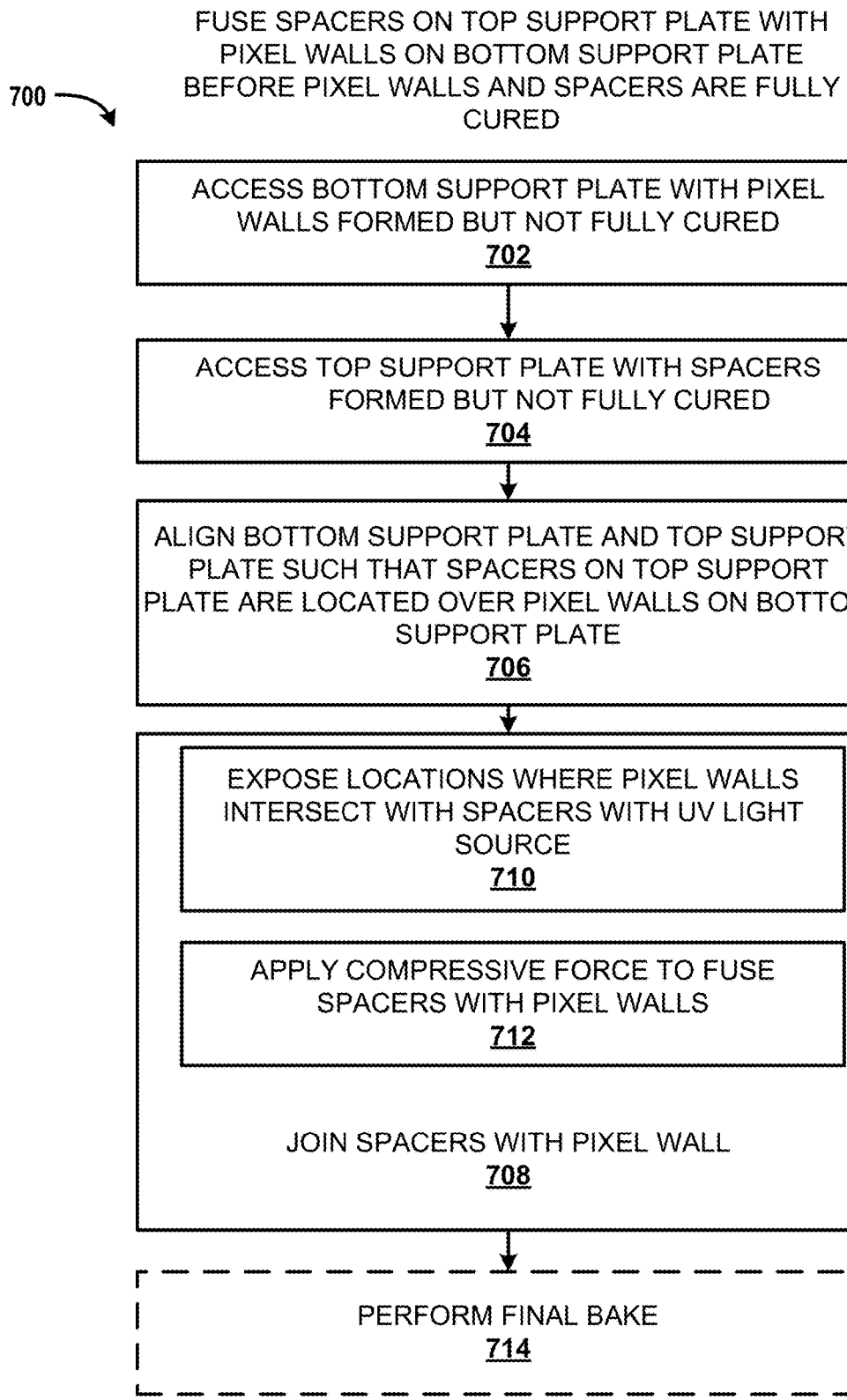
FIG. 7 is a flow diagram showing a routine illustrating aspects of a mechanism disclosed herein for joining spacers on a top support plate with the pixel walls on a bottom support plate.

FIGS. 5-7 are flow diagrams showing routines that illustrate aspects of joining pixel walls with spacers according to an example disclosed herein. The implementation of the various components described herein is a matter of choice. It should also be appreciated that more or fewer operations may be performed than shown in the FIGS. and described herein. These operations may also be performed in parallel, or in a different order than those described herein.

FIG. 5 is a flow diagram showing a routine 500 illustrating aspects of a mechanism disclosed herein for creating pixel walls on a bottom support plate that are not fully cured. The routine 500 may begin at 502, where a bottom support plate is coated with photoresist. As discussed above, different techniques may be used to coat a support plate. For instance, spin coating may be performed by dispensing the photoresist material onto the bottom support plate that is affixed to a plate that is rotating between 1200 to 4800 rpm for 30 to 60 seconds depending on the desired thickness. In some examples, the spin coating produces a final thickness of about 3 to 5 µm high for pixel walls.

At 504, the bottom support plate coated with the photoresist material is exposed to a pre-exposure bake (e.g., soft-baked). Generally, pre-exposure baking or soft-baking refers to exposing the photoresist material to a low temperature (e.g., about 100-130° C.) for a short period of time. In some examples, the pre-exposure bake is for about 5 minutes at about 120° C. The pre-exposure bake is directed at reducing any remaining solvent concentration that exists in the photoresist. The pre-exposure bake may also improve the adhesion of the photoresist to the support plate.

At 506, the pixel wall mask is placed over the bottom support plate that is coated with the photoresist material. As discussed above, the pixel wall mask is used to form the pixel walls that are used to retain the oil used in the electrowetting display. In some examples, the pixel wall mask forms the pixel walls to have a specified width and length. The pixel wall mask, however, may form pixel walls of any shape or size. According to some examples, a hexamethyl disilazene (HMDS) primer may be used prior to coating the bottom support plate with photoresist material.

At 508, the photoresist material is exposed to UV light. The exposure of the photoresist material that is not covered by the pixel wall mask causes a chemical change in the photoresist. When positive photoresist is used, the exposed regions of the photoresist become soluble in the developer. In negative photoresist, on the other hand, the unexposed regions are soluble in the developer. In some examples, the UV light may be a mercury lamp that is filtered to emit wavelengths between about 350-450 nm.

At 510, a post-exposure bake is performed after exposing the photoresist material to the UV light. The post-exposure bake may resemble the post-exposure bake. In some examples, the pre-exposure bake is about five minutes at 130° C.

At 512, the photoresist material is subjected to a developer. In some examples, the developer may be sprayed onto the photoresist material, and/or delivered on a spin coater, much like photoresist is coated. Metal-ion-free developers such as tetramethylammonium hydroxide (TMAH) are used in some examples. After exposing the photoresist material to the developer, the pixel walls are formed on the bottom support plate.

FIG. 6 is a flow diagram showing a routine 600 illustrating aspects of a mechanism disclosed herein for creating spacers on a top support plate that are not fully cured. The routine 600 may begin at 602, where a top support plate is coated with photoresist material to form a photoresist layer. As discussed above, different techniques may be used to coat a support plate with photoresist material. In some examples, the photoresist material (e.g., SU-8) is the same photoresist material that is used in coating the bottom support plate. In other examples, the photoresist material may be different from the photoresist material used in coating the bottom support plate.

According to some configurations, the photoresist material coating produces a thickness that results in a final height of about 20 µm high for the spacers. The top support plate may be coated with different thicknesses of photoresist material depending on the desired height of the spacers.

At 604, the top support plate coated with the photoresist material is exposed to a pre-exposure bake. For example, the photoresist on the top plate may be exposed to a temperature of about 100-130° C. for approximately 5 minutes.

At 606, the spacer mask is placed over the top support plate that is coated with the photoresist material. As discussed above, the spacer mask forms the locations of the spacers that are used to provide structural stability for the electrowetting display. In some examples, the spacer mask forms a cross shape that is 15 μm wide, and 25 μm in width. The spacer mask, however, may be of any shape or size. For instance, the shapers may be other sized crosses, rectangles, squares, circles, ovals, or some other shape.

At 608, the photoresist material covered by the spacer mask is exposed to UV light. The exposure of the photoresist material that is not covered by the spacer mask causes a chemical change in the photoresist material.

At 610, a post-exposure bake is performed after exposing the photoresist material to the UV light. The post-exposure bake resembles the pre-exposure bake. In some examples, the pre-exposure bake is about five minutes at 130° C.

At 612, the photoresist material is subjected to a developer. As discussed above, a metal-ion-free developers such as tetramethylammonium hydroxide (TMAH) may be used. According to some configurations, 150 ml/plate of developer may be used to develop the photoresist material. After subjecting the photoresist to the developer, the spacers are formed on the top support plate.

FIG. 7 is a flow diagram showing a routine 700 illustrating aspects of a mechanism disclosed herein for joining spacers on a top support plate with the pixel walls on a bottom support plate. The routine 700 may begin at 702, where a bottom support plate including the formed pixel walls is accessed. As discussed above, the bottom support plate may include pixel walls formed using photoresist.

At 704, the top support plate including the spacers is accessed. As discussed above, the spacers may be created using the same or similar material (e.g., SU-8) as the pixel walls formed on the bottom support plate. According to some configurations, the spacer formation process produces about 20 μm high spacers. As also discussed above, the spacers and the pixel walls are not fully cured (e.g., "hardened") before the joining as discussed below with regard to the joining as discussed at 708. In some examples, the final bake of the top support plate with the spacers and the final bake of the bottom support plate with the pixel walls is not performed. In other examples, a shortened lower temperature bake is performed such that the spacers and the pixel walls remain somewhat "tacky" or not "fully cured".

At 706, the bottom support plate is aligned with the top support plate such that the spacers on the top support plate are located over the pixel walls on the bottom support plate. As discussed above, in some examples, the spacers are to be placed over the corners of the pixel walls. In other examples, the spacers may be placed at other locations over the pixel walls (e.g., every other corner).

At 708, the spacers and the pixel walls are joined. As discussed above, different techniques may be used to fuse the spacers with the pixel walls. In some configurations, at 710, the locations where the pixel walls intersect with the spacers are exposed to UV light to more fully cure the photoresist. According to some examples, the light source is positioned such that the light enters through a openings in the black matrix and exposes the locations where the spacers are in contact with the pixel walls.

As also discussed above, in some examples, at 712, compressive force may be used to fuse the spacers with the pixel walls. For instance, after aligning the spacers with the pixel wall, a force may be applied such that the spacers and the pixel walls are pressed together with sufficient force to fuse the spacers with the pixel walls. In some examples, a combination of exposing the pixel walls and spacers to the UV light as well as applying the compressive force is utilized when joining the spacers with the pixel walls.

At 714, a final bake may be performed when determined. In some configurations a final bake may not be performed. In other examples, a final bake may be performed in an attempt to "harden" the joined spacer and pixel wall. As discussed above, in some examples, the final bake may be similar to the pre-exposure bake. In some examples, the final bake exposes the joined spacers and pixel walls to a temperature of about 130° C. for about five minutes to fifteen minutes. In other examples, a higher temperature up to about 220° C. may be utilized.

Figure 8:
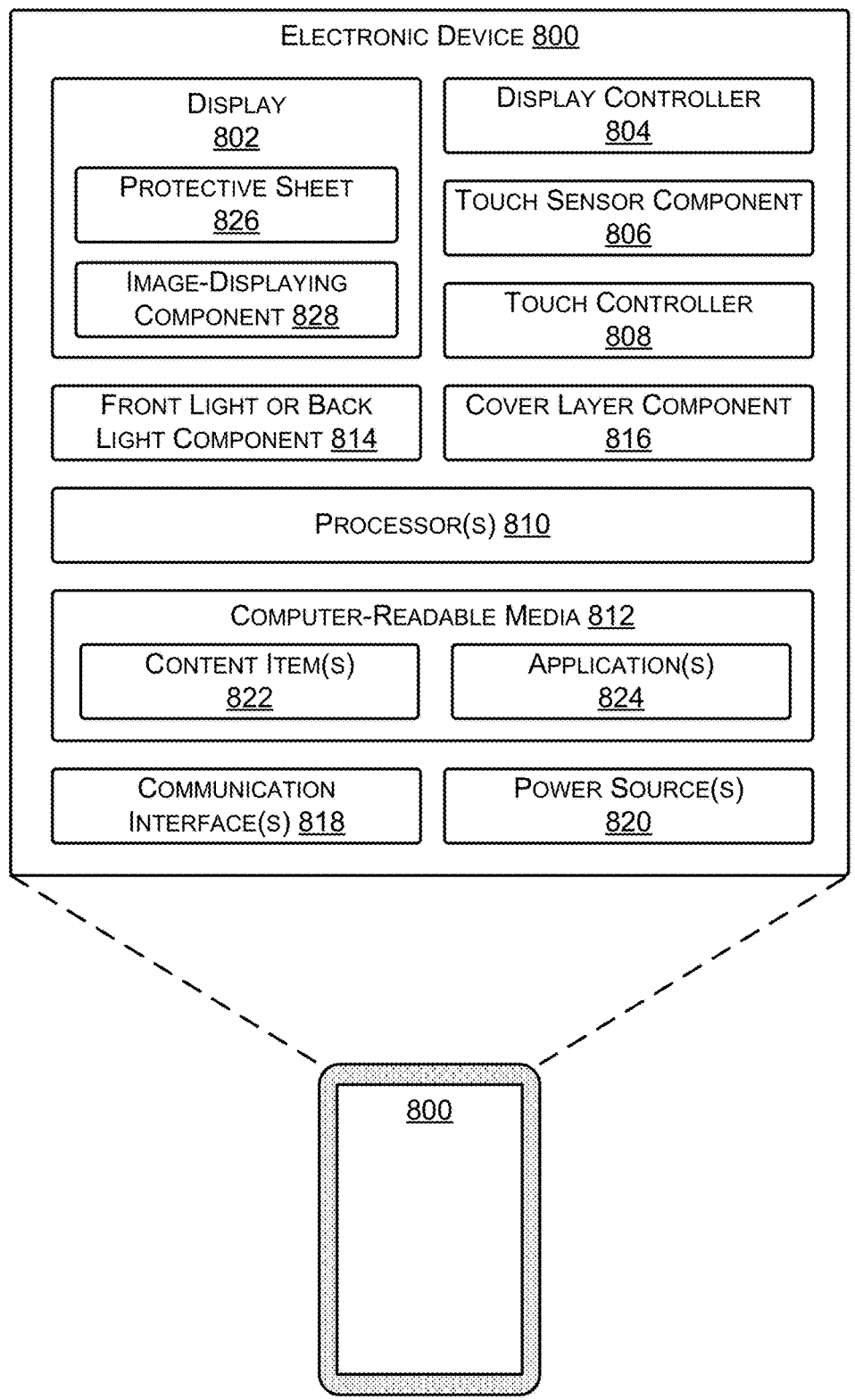
FIG. 8 illustrates an example electronic device that may incorporate a display device including joined spacers and pixel walls, according to some examples.

FIG. 8 illustrates an example electronic device 800 that may incorporate any of the display devices including joined spacers and pixel walls as discussed above. The device 800 may comprise any type of electronic device having a display. For instance, the device 800 may be a mobile electronic device (e.g., an electronic book reader, a tablet computing device, a laptop computer, a smart phone or other multi-function communication device, a portable digital assistant, a wearable computing device, an automotive display, etc.). Alternatively, the device 800 may be a non-mobile electronic device (e.g., a computer display, a television, etc.). In addition, while FIG. 8 illustrates several example components of the electronic device 800, it is to be appreciated that the device 800 may also include other conventional components, such as an operating system, system busses, input/output components, and the like. Further, in other examples, such as in the case of a television or computer monitor, the electronic device 800 may only include a subset of the components illustrated.

Regardless of the specific implementation of the electronic device 800, the device 800 includes a display 802 and a corresponding display controller 804. The display 802 may represent a reflective or transmissive display in some instances, such as an electronic paper display, a reflective or transmissive LCD display, or the like. Electronic paper displays represent an array of display technologies that largely mimic the look of ordinary ink on paper. In contrast to conventional backlit displays, electronic paper displays typically reflect light, much as ordinary paper does. In addition, electronic paper displays are often bi-stable, meaning that these displays are capable of holding text or other rendered images even when very little or no power is supplied to the display. Some examples of the display 802 that may be used with the implementations described herein include bi-stable LCD displays, micro electromechanical system (MEMS) displays, such as interferometric modulator displays, cholesteric displays, electrophoretic displays, electrofluidic pixel displays, electrowetting displays, photonic ink displays, gyricon displays, and the like. In other implementations, or for other types of devices 800, the display 802 may be an active display such as a liquid crystal display, a plasma display, a light emitting diode display, an organic light emitting diode display, an electrowetting display and so forth. Accordingly, implementations herein are not limited to any particular display technology.

In an implementation, the display comprises an electrowetting display that employs an applied voltage to change the surface tension of a fluid in relation to a surface. For example, such an electrowetting display may be the same as or similar to the electrowetting displays illustrated in FIGS. 1 and 2, though claimed subject matter is not limited in this respect. By applying a voltage to a hydrophobic surface, the wetting properties of the surface can be modified so that the surface becomes increasingly hydrophilic. As one example of an electrowetting display, the modification of the surface tension acts as an optical switch by contracting a colored oil film when a voltage is applied to individual pixels or subpixels of the display.

When the voltage is absent, the colored oil forms a continuous film within a pixel or subpixel, and the color may thus be visible to a user of the display. On the other hand, when the voltage is applied to the pixel or subpixel, the colored oil is displaced and the pixel or subpixel becomes transparent. When multiple pixels or subpixels of the display are independently activated, the display can present a color or grayscale image. The pixels or subpixels may form the basis for a transmissive, reflective, or transmissive/reflective (transflective) display. Further, the pixels or subpixels may be responsive to high switching speeds (e.g., on the order of several milliseconds), while employing small pixel or sub-pixel dimensions. Accordingly, the electrowetting displays herein may be suitable for applications such as displaying video content.

Of course, while several different examples have been given, it is to be appreciated that the reflective displays described herein may comprise any other type of electronic-paper technology or reflective-display technology, examples of which are provided above. In addition, while some of the examples described above are discussed as rendering black, white, and varying shades of gray, it is to be appreciated that the described techniques apply equally to reflective displays capable of rendering color pixels or subpixels. As such, the terms "white," "gray," and "black" may refer to varying degrees of color in implementations utilizing color displays. For instance, where a pixel or subpixel includes a red color filter, a "gray" value of the pixel or subpixel may correspond to a shade of pink while a "white" value of the pixel or subpixel may correspond to a most luminant red of the color filter. Furthermore, while some examples herein are described in the environment of a reflective display, in other examples, the display 802 may represent a backlit display, examples of which are mentioned above.

In addition to including the display 802, FIG. 8 illustrates that some examples of the device 800 may include a touch sensor component 806 and a touch controller 808. In some instances, at least one touch sensor component 806 resides with, or is stacked on, the display 802 to form a touch-sensitive display (e.g., an electronic paper touch-sensitive display). Thus, the display 802 may be capable of both accepting user touch input and rendering content in response to or corresponding to the touch input. As several examples, the touch sensor component 806 may comprise a capacitive touch sensor, a force sensitive resistance (FSR), an interpolating force sensitive resistance (IFSR) sensor, or any other type of touch sensor. In some instances, the touch sensor component 806 is capable of detecting touches as well as determining an amount of pressure or force of these touches.

FIG. 8 further illustrates that the electronic device 800 may include one or more processors 810 and one or more computer-readable media 812, as well as a front light component 814 (which may alternatively be a backlight component in the case of a backlit display) for lighting the display 802, a cover layer component 816, such as a cover glass or cover sheet, one or more communication interfaces 818 and one or more power sources 820. The communication interfaces 818 may support both wired and wireless connection to various networks, such as cellular networks, radio, WiFi networks, short range networks (e.g., Bluetooth®), infrared (IR), and so forth.

Depending on the configuration of the electronic device 800, the computer-readable media 812 (and other computer-readable media described throughout) is an example of computer storage media and may include volatile and non-volatile memory. Thus, the computer-readable media 812 may include, but is not limited to, RAM, ROM, EEPROM, flash memory, or other memory technology, or any other medium that can be used to store computer-readable instructions, programs, applications, media items, and/or data which can be accessed by the electronic device 800.

The computer-readable media 812 may be used to store any number of functional components that are executable on the processor 810, as well as content items 822 and applications 824. Thus, the computer-readable media 812 may include an operating system and a storage database to store one or more content items 822, such as eBooks, audio books, songs, videos, still images, and the like. The computer-readable media 812 of the electronic device 800 may also store one or more content presentation applications to render content items on the device 800. These content presentation applications may be implemented as various applications 824 depending upon the content items 822. For instance, the content presentation application may be an electronic book reader application for rending textual electronic books, an audio player for playing audio books or songs, a video player for playing video, and so forth.

In some instances, the electronic device 800 may couple to a cover (not illustrated in FIG. 8) to protect the display (and other components in the display stack or display assembly) of the device 800. In one example, the cover may include a back flap that covers a back portion of the device 800 and a front flap that covers the display 802 and the other components in the stack. The device 800 and/or the cover may include a sensor (e.g., a Hall effect sensor) to detect when the cover is open (i.e., when the front flap is not atop the display and other components). The sensor may send a signal to the front light component 814 when the cover is open and, in response, the front light component 814 may illuminate the display 802. When the cover is closed, meanwhile, the front light component 814 may receive a signal indicating that the cover has closed and, in response, the front light component 814 may turn off.

Furthermore, the amount of light emitted by the front light component 814 may vary. For instance, upon a user opening the cover, the light from the front light may gradually increase to its full illumination. In some instances, the device 800 includes an ambient light sensor (not illustrated in FIG. 8) and the amount of illumination of the front light component 814 may be based at least in part on the amount of ambient light detected by the ambient light sensor. For example, the front light component 814 may be dimmer if the ambient light sensor detects relatively little ambient light, such as in a dark room; may be brighter if the ambient light sensor detects ambient light within a particular range; and may be dimmer or turned off if the ambient light sensor detects a relatively large amount of ambient light, such as direct sunlight.

In addition, the settings of the display 802 may vary depending on whether the front light component 814 is on or off, or based on the amount of light provided by the front light component 814. For instance, the electronic device 800 may implement a larger default font or a greater contrast when the light is off compared to when the light is on. In some instances, the electronic device 800 maintains, when the light is on, a contrast ratio for the display that is within a certain percentage of the contrast ratio when the light is off.

As described above, the touch sensor component 806 may comprise a capacitive touch sensor that resides atop the display 802. In some examples, the touch sensor component 806 may be formed on or integrated with the cover layer component 816. In other examples, the touch sensor component 806 may be a separate component in the stack of the display assembly. The front light component 814 may reside atop or below the touch sensor component 806. In some instances, either the touch sensor component 806 or the front light component 814 is coupled to a top surface of a protective sheet 826 of the display 802. As one example, the front light component 814 may include a lightguide sheet and a light source (not illustrated in FIG. 8). The lightguide sheet may comprise a substrate (e.g., a transparent thermoplastic such as PMMA or other acrylic), a layer of lacquer and multiple grating elements formed in the layer of lacquer that function to propagate light from the light source towards the display 802, thus illuminating the display 802.

The cover layer component 816 may include a transparent substrate or sheet having an outer layer that functions to reduce at least one of glare or reflection of ambient light incident on the electronic device 800. In some instances, the cover layer component 816 may comprise a hard-coated polyester and/or polycarbonate film, including a base polyester or a polycarbonate, that results in a chemically bonded UV-cured hard surface coating that is scratch resistant. In some instances, the film may be manufactured with additives such that the resulting film includes a hardness rating that is greater than a predefined threshold (e.g., at least a hardness rating that is resistant to a 3$h$ pencil). Without such scratch resistance, a device may be more easily scratched and a user may perceive the scratches from the light that is dispersed over the top of the reflective display. In some examples, the protective sheet 826 may include a similar UV-cured hard coating on the outer surface. The cover layer component 816 may couple to another component or to the protective sheet 826 of the display 802. The cover layer component 816 may, in some instances, also include a UV filter, a UV-absorbing dye, or the like, for protecting components lower in the stack from UV light incident on the electronic device 800. In still other examples, the cover layer component 816 may include a sheet of high-strength glass having an antiglare and/or antireflective coating.

The display 802 includes the protective sheet 826 overlying an image-displaying component 828. For example, the display 802 may be preassembled to have the protective sheet 826 as an outer surface on the upper or image-viewing side of the display 802. Accordingly, the protective sheet 826 may be integral with and may overlie the image-displaying component 828. The protective sheet 826 may be optically transparent to enable a user to view, through the protective sheet 826, an image presented on the image-displaying component 828 of the display 802.

In some examples, the protective sheet 826 may be a transparent polymer film in the range of 25 to 200 micrometers in thickness. As several examples, the protective sheet may be a transparent polyester, such as polyethylene terephthalate (PET) or polyethylene naphthalate (PEN), or other suitable transparent polymer film or sheet, such as a polycarbonate or an acrylic. In some examples, the outer surface of the protective sheet 826 may include a coating, such as the hard coating described above. For instance, the hard coating may be applied to the outer surface of the protective sheet 826 before or after assembly of the protective sheet 826 with the image-displaying component 828 of the display 802. In some examples, the hard coating may include a photoinitiator or other reactive species in its composition, such as for curing the hard coating on the protective sheet 826. Furthermore, in some examples, the protective sheet 826 may be dyed with a UV-light-absorbing dye, or may be treated with other UV-absorbing treatment. For example, the protective sheet may be treated to have a specified UV cutoff such that UV light below a cutoff or threshold wavelength is at least partially absorbed by the protective sheet 826, thereby protecting the image-displaying component 828 from UV light.

According to some implementations herein, one or more of the components discussed above may be coupled to the display 802 using fluid optically-clear adhesive (LOCA). For example, suppose that the light guide portion of the front light component 814 is to be coupled to the display 802. The light guide may be coupled to the display 802 by placing the LOCA on the outer or upper surface of the protective sheet 826. When the LOCA reaches the corner(s) and/or at least a portion of the perimeter of protective sheet, UV-curing may be performed on the LOCA at the corners and/or the portion of the perimeter. Thereafter, the remaining LOCA may be UV-cured and the front light component 814 may be coupled to the LOCA. By first curing the corner(s) and/or perimeter, the techniques effectively create a barrier for the remaining LOCA and also prevent the formation of air gaps in the LOCA layer, thereby increasing the efficacy of the front light component 814. In other implementations, the LOCA may be placed near a center of the protective sheet 826, and pressed outwards towards a perimeter of the top surface of the protective sheet 826 by placing the front light component 814 on top of the LOCA. The LOCA may then be cured by directing UV light through the front light component 814. As discussed above, and as discussed additionally below, various techniques, such as surface treatment of the protective sheet, may be used to prevent discoloration of the LOCA and/or the protective sheet 826.

While FIG. 8 illustrates a few example components, the electronic device 800 may have additional features or functionality. For example, the device 800 may also include additional data storage devices (removable and/or non-removable) such as, for example, magnetic disks, optical disks, or tape. The additional data storage media, which may reside in a control board (not illustrated), may include volatile and nonvolatile, removable and non-removable media implemented in any method or technology for storage of information, such as computer readable instructions, data structures, program modules, or other data. In addition, some or all of the functionality described as residing within the device 800 may reside remotely from the device 800 in some implementations. In these implementations, the device 800 may utilize the communication interfaces 818 to communicate with and utilize this functionality.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

One skilled in the art will realize that a virtually unlimited number of variations to the above descriptions are possible, and that the examples and the accompanying figures are merely to illustrate one or more examples of implementations.

It will be understood by those skilled in the art that various other modifications can be made, and equivalents can be substituted, without departing from claimed subject matter. Additionally, many modifications can be made to adapt a particular situation to the teachings of claimed subject matter without departing from the central concept described herein. Therefore, it is intended that claimed subject matter not be limited to the particular examples disclosed, but that such claimed subject matter can also include all examples falling within the scope of the appended claims, and equivalents thereof.

In the detailed description above, numerous specific details are set forth to provide a thorough understanding of claimed subject matter. However, it will be understood by those skilled in the art that claimed subject matter can be practiced without these specific details. In other instances, methods, apparatuses, or systems that would be known by one of ordinary skill have not been described in detail so as not to obscure claimed subject matter.

Reference throughout this specification to "one example" or "an example" can mean that a particular feature, structure, or characteristic described in connection with a particular example can be included in at least one example of claimed subject matter. Thus, appearances of the phrase "in one example" or "an example" in various places throughout this specification are not necessarily intended to refer to the same example or to any one particular example described. Furthermore, it is to be understood that particular features, structures, or characteristics described can be combined in various ways in one or more examples. In general, of course, these and other issues can vary with the particular context of usage. Therefore, the particular context of the description or the usage of these terms can provide helpful guidance regarding inferences to be drawn for that context.

The invention claimed is:

1. A method for joining a spacer and a pixel wall of an electrowetting display comprising:
   coating a bottom support plate with a first photoresist;
   placing a pixel wall mask over the first photoresist, the pixel wall mask covering a first portion of the first photoresist;
   exposing the pixel wall mask and a second portion of the first photoresist to ultraviolet (UV) light for a first period of time;
   dissolving the second portion of the first photoresist with a developer such that the pixel walls are formed on the bottom support plate;
   coating a top support plate with a second photoresist;
   placing a spacer mask over the second photoresist, the spacer mask covering a first portion of the second photoresist;
   exposing the spacer mask and a second portion of the second photoresist to UV light for a second period of time;
   dissolving the second portion of the exposed second photoresist with a developer such that spacers are formed on the top support plate; and
   before the first photoresist and the second photoresist are fully cured,
      aligning the bottom support plate with the top support plate such that bottoms of the spacers are aligned with and touching tops of the pixel walls, and
      joining the spacers with the pixel walls to form joined spacers and pixel walls, the joining including positioning a UV light source above the spacers and the pixel walls, and exposing junctions of the spacers and the pixel walls to UV light output by the UV light source to join the first photoresist and the second photoresist.

2. The method of claim 1, further comprising baking the joined spacers and pixel walls at a temperature that further chemically bonds the joined spacers and pixel walls.

3. The method of claim 1, wherein positioning the UV light source above the spacers and the pixel walls comprises positioning the UV light source above a first opening in the black matrix grid that exposes a first junction of a first spacer and a first pixel wall.

4. The method of claim 1, wherein joining the pixel walls with the spacers further comprises applying a compressive force to the top support plate and the bottom support plate to compress the spacers and the pixel walls.

5. A method, comprising:
   positioning a first support plate of an electronic display with respect to a second support plate of the electronic display such that a partially cured spacer on the second support plate is in contact with a partially cured pixel wall on the first support plate; and
   joining the pixel wall with the spacer to form a joined spacer and pixel wall such that the first support plate and the second support plate are physically coupled.

6. The method of claim 5, further comprising:
   coating the first support plate with a first photoresist;
   placing a first mask over the first photoresist;
   exposing the first mask to a light source; and
   dissolving a portion of the first photoresist with a developer such that the pixel walls are formed on the first support plate.

7. The method of claim 5, further comprising:
   coating the second support plate with a second photoresist;
   placing a second mask over the second photoresist;
   exposing the second mask to a light source; and
   dissolving a portion of the second photoresist with a developer such that spacers are formed on the second support plate.

8. The method of claim 7, wherein coating the second support plate with the second photoresist comprises performing one or more of spin-coating or slit-coating such that a thickness of the second photoresist forms the spacers that are about 20 μm.

9. The method of claim 5, further comprising baking the joined spacer and pixel wall to a temperature that chemically bonds the pixel wall and the spacer.

10. The method of claim 5, wherein joining the pixel wall with the spacer comprises positioning a UV light source above a junction of the pixel wall and the spacer, and exposing the junction to UV light produced by the UV light source such that further curing of a first photoresist and a second photoresist occurs.

11. The method of claim 10, wherein positioning the UV light source above the junction of the pixel wall and the spacer comprises positioning the UV light source above an opening in a black matrix grid that is located above the spacer, wherein the opening is smaller as compared to one or more of a width of the spacer or a width of the pixel wall.

12. The method of claim 5, wherein joining the pixel walls with the spacers comprises applying a compressive force to the spacer and the pixel wall.

13. The method of claim 5, wherein the spacer is one of a cross-like shape or a diamond shape that is positioned above a corner of the pixel wall formed on a first photoresist.

14. The method of claim 5, wherein joining the pixel walls with the spacers comprises exposing at least a portion of the pixel wall and the spacer to a UV light source and heating at least the portion of the pixel wall and the spacer to a temperature of at least 100° centigrade.

15. An electrowetting display comprising:
   a first support plate comprising a pixel wall and a second support plate opposite to the first support plate, wherein electrowetting elements are provided between the first support plate and the second support plate;

a first fluid within the electrowetting elements and disposed between the pixel walls on the first support plate;

a second fluid disposed on the first fluid, wherein the second fluid is substantially immiscible with the first fluid; and a spacer disposed on the second support plate that is joined to the pixel wall to form a chemically bonded spacer and pixel wall, wherein the first support plate includes a first partially cured photoresist that forms the pixel wall, and the second support plate includes a second partially cured photoresist that forms the spacer.

16. The electrowetting display of claim 15, further comprising a black matrix grid layer located above the second support plate, the black matrix grid including at least a partially transparent area above the spacer.

17. The electrowetting display of claim 15, wherein the pixel wall and the spacer are formed from a same type of photoresist.

18. The electrowetting display of claim 15, further comprising a color filter element disposed above the second support plate and a reflective layer located above the first support plate.

19. The electrowetting display of claim 15, wherein the spacer is positioned on a corner formed by the pixel wall.

* * * * *